United States Patent [19]
Matsunaga

[11] Patent Number: 5,142,168
[45] Date of Patent: Aug. 25, 1992

[54] EMITTER-COUPLED LOGIC BALANCED SIGNAL TRANSMISSION CIRCUIT

[75] Inventor: Hiroshi Matsunaga, Kanagawa, Japan

[73] Assignee: Fujitsu Limited, Kanagawa, Japan

[21] Appl. No.: 630,061

[22] Filed: Dec. 19, 1990

[30] Foreign Application Priority Data

Dec. 25, 1989 [JP] Japan .................. 1-335829

[51] Int. Cl.$^5$ .............................................. H03F 3/45
[52] U.S. Cl. ................................... 307/446; 307/443; 307/455; 307/475; 330/253
[58] Field of Search ............... 307/443, 446, 455, 475, 307/542, 355; 330/253

[56] References Cited

U.S. PATENT DOCUMENTS

| 4,586,000 | 4/1986 | Wagner | 330/253 |
| 4,616,189 | 10/1986 | Pengue, Jr. | 330/253 |
| 4,686,395 | 8/1987 | Sato et al. | 307/443 |
| 4,961,010 | 10/1990 | Davis | 307/451 |
| 4,982,120 | 1/1991 | Longwell et al. | 307/542 |
| 5,004,936 | 4/1991 | Andresen | 307/443 |
| 5,013,938 | 5/1991 | Estrada | 307/455 |

OTHER PUBLICATIONS

MECL Integrated Circuits Data Book, Motorola Inc., 1973, third edition, pp. 3, 56.

Primary Examiner—Stanley D. Miller
Assistant Examiner—Scott A. Ouellette
Attorney, Agent, or Firm—Helfgott & Karas

[57] ABSTRACT

A signal transmission circuit which transmits a signal over a transmission line includes a line driver circuit comprising a differential amplifier and an emitter follower circuit connected thereto, and a metal oxide semiconductor field-effect transistor which provides a high impedance when power supply from a power supply source is turned off and, thereby, causes the line driver circuit to provide a high output impedance to the transmission line when power supply is turned off.

7 Claims, 6 Drawing Sheets

EMITTER-COUPLED LOGIC BALANCED SIGNAL TRANSMISSION CIRCUIT

BACKGROUND OF THE INVENTION

Field of the Invention

The present invention relates to a signal transmission circuit, and more particularly to a line driver for transmitting an ECL logic signal over a 2-wire balanced line interconnecting printed circuit boards or devices.

In a recent high-speed computer system, an emitter-coupled logic (ECL) is widely used, which operates transistors in a non-saturated operation area to realize high-speed switching. Meanwhile, since memory and logic circuits are now fabricated in large-scale integration (LSI) semiconductor technology and reliability of a computer system is further increased, a power failure becomes one of the main causes of a system failure.

Accordingly, a line driver which is not only compatible, both electrically and in switching speed, with the ECL logic, but is reliable, i.e., which can correctly and quickly detect a power-off state developed at the sending end and inform the receiving end of such state, is in great demand.

DESCRIPTION OF THE PRIOR ART

A conventional ECL line driver will be now described in connection with FIG. 1 which is a diagram showing an example of such ECL line driver. A line driver 3, whose circuit configuration is well-known as MC 10125 disclosed, for example, in MECL Integrated Circuits Data Book issued by Motorola Semi-conductor Products Inc., 1973, Third Edition, page 56, includes a differential amplifier circuit 1 including transistors Q1 and Q2 and an emitter follower circuit 2 including transistors Q4 and Q5. The collectors of the transistors Q1 and Q2 of the differential amplifier 1 are connected to the respective bases of the transistors Q5 and Q4 of the emitter follower circuit 2. The emitter follower circuit 2 provides high input impedance and low output impedance. Voltage source 0 volts (ground) and −5.2 (or −4.5) volts provide power supply to the line driver 3. The line driver 3 further comprises a circuit including transistor Q3, resistors R3, R4 and R5, and diodes D1 and D2 for providing a reference voltage Vref to the base of the transistor Q2. Resistors R1 and R2 are connected to the voltage source 0 volts (ground) and to the collectors of transistors Q1 and Q2, respectively. Constant current supply Si feeds a current required to make the emitter follower circuit 2 output a predetermined voltage level. An input signal is provided to the base of transistor Q1 via input terminal Ti. Resistor Ri is connected between the input terminal Ti and the voltage source line −5.2 V. Resistor R10 is connected to the constant current supply in the amplifier circuit. The voltage difference between the input signal voltage and the reference voltage Vref is amplified by the differential amplifier circuit 1 and is output to the emitter follower circuit 2, which drives the balanced line via output terminal To.

FIG. 2 is an electric diagram illustrating a prior art balanced line transmission system.

In a transmission system including the line driver 3 and a line receiver 4 with a line 10 interconnecting the driver and the receiver and terminated by 50-ohm terminator resistors Ra and Rb, when the balanced line 10 between the sending and receiving ends is disconnected, −2 volts is provided to the input of the line receiver 4. Typically, a circuit shown in FIG. 3, which has substantially the same circuit configuration and function as the line driver 3 shown in FIG. 1 except that it has two inputs, is used as the line receiver 4. In FIG. 2, when the line 10 is disconnected and the inputs of the line receiver 4 are open-circuited, the line receiver 4 can detect a line-disconnected state, because it provides a steady high-level output at terminal X and a low-level output at terminal Y (FIG. 3). However, when power supply is turned off, both transistors Q4 and Q5 of the line driver 3 turn on and a current flows from the 0-volt voltage source of the line driver 3 to the −2-volt voltage source of the line receiver 4 via the terminator resistors Ra and Rb. As a result, a high level (ground) signal is provided to both inputs of the line receiver 4, causing the line receiver 4 to provide an indefinite output or, under some circumstances, to vibrate in synchronization with a white noise. Accordingly, to detect and inform the receiving end of a power-off state developed at the sending end, a check circuit shown in FIG. 4 is used.

FIG. 4 is a schematic block diagram of a check circuit for practicing the prior art sending and receiving circuits, which includes a plurality of line drivers 31 and a plurality of line receivers 41 which correspond to those shown in FIG. 1 and FIG. 3, respectively. A transmission system of the prior art includes an extra pulse signal line in addition to data and control signal lines. Pulse generator 5 at the sending end continuously transmits a pulse signal with a predetermined duty ratio. A pulse checker 6 provided at the receiving end checks the pulse signal for a correct duty ratio. Thus, when the pulse checker 6 fails to receive a correct pulse signal, it recognizes a power-off state developed at the sending end and outputs a logical zero ("0") signal to AND gates 7 to inhibit the data and control signals from being input to the following stages (not shown) of the receiving end.

A problem with the prior art system is that the check circuit is not reliable because the pulse checker 6 determines a power-off state indirectly by checking the pulse signal for a correct duty ratio which may vary by causes other than a power-off state.

Another problem of the prior art is that the check circuit is not economical because it requires an extra signal line for checking use and associated circuits.

SUMMARY OF THE INVENTION

It is an object of the present invention to provide a signal transmission circuit for use with a balanced line, which can correctly and quickly detect a power-off state developed at the sending end and inform the receiving end of the state at the sending end.

It is another object of the present invention to provide an economical signal transmission circuit for use with a balanced line by reducing the number of circuit elements required for detecting a power-off state at the sending end and informing the receiving end of the state of the sending end.

To achieve the above and other objects, the signal transmission circuit according to the present invention comprises a line driver circuit for driving a transmission line, and at least one resistor element included in the line driver circuit and constructed to provide a high impedance when power supply is turned off and, thereby to make the line driver circuit provide a high output impedance to the transmission line when the power supply is turned off.

These together with other objects and advantages which will be subsequently apparent, reside in the details of construction and operation as more fully hereinafter described and claimed, reference being had to the accompanying drawings forming a part hereof, wherein like numerals referred to like parts throughout.

DETAILED DESCRIPTION OF THE PREFERRED EMBODIMENTS

Figure 5:
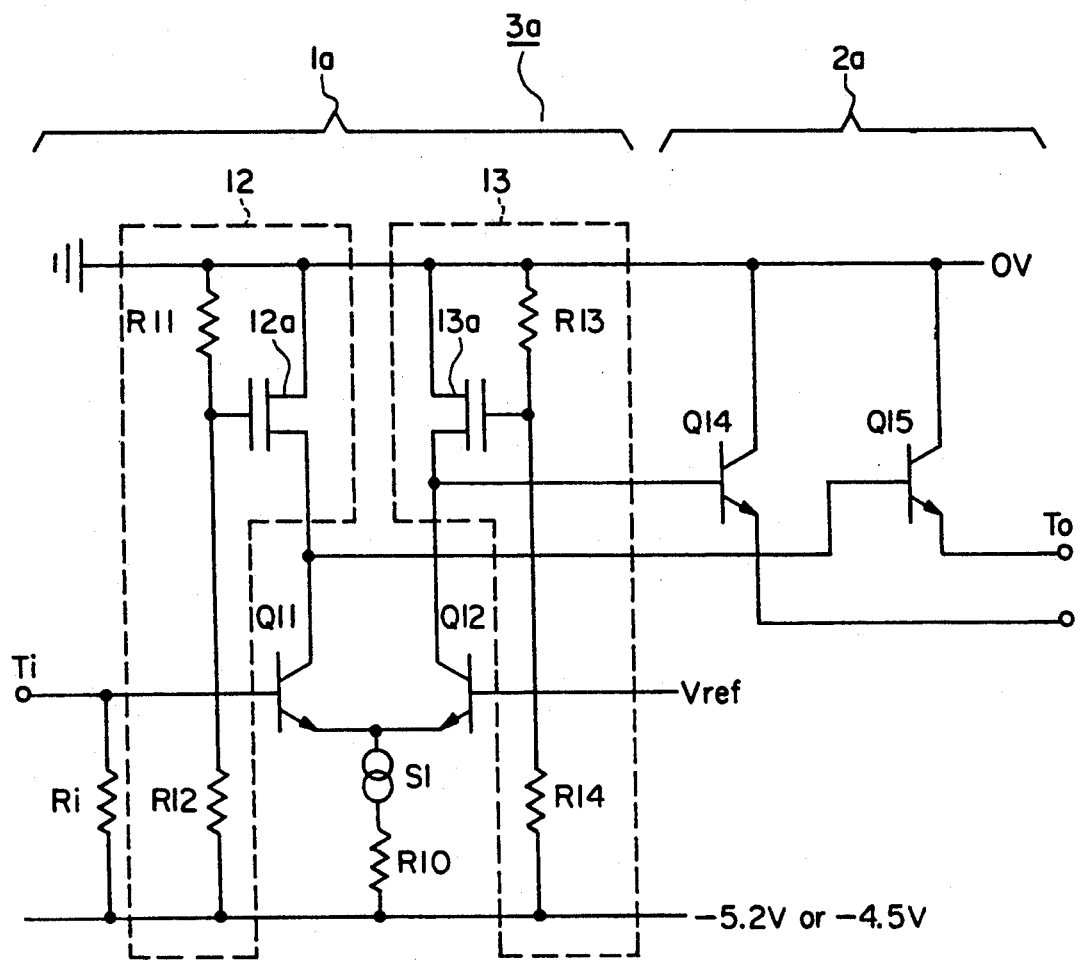
FIG. 5 is a diagram showing a line driver circuit of a first embodiment of the present invention.

FIG. 5 is an electric diagram of a line driver circuit of the first embodiment of the present invention.

Figure 1:
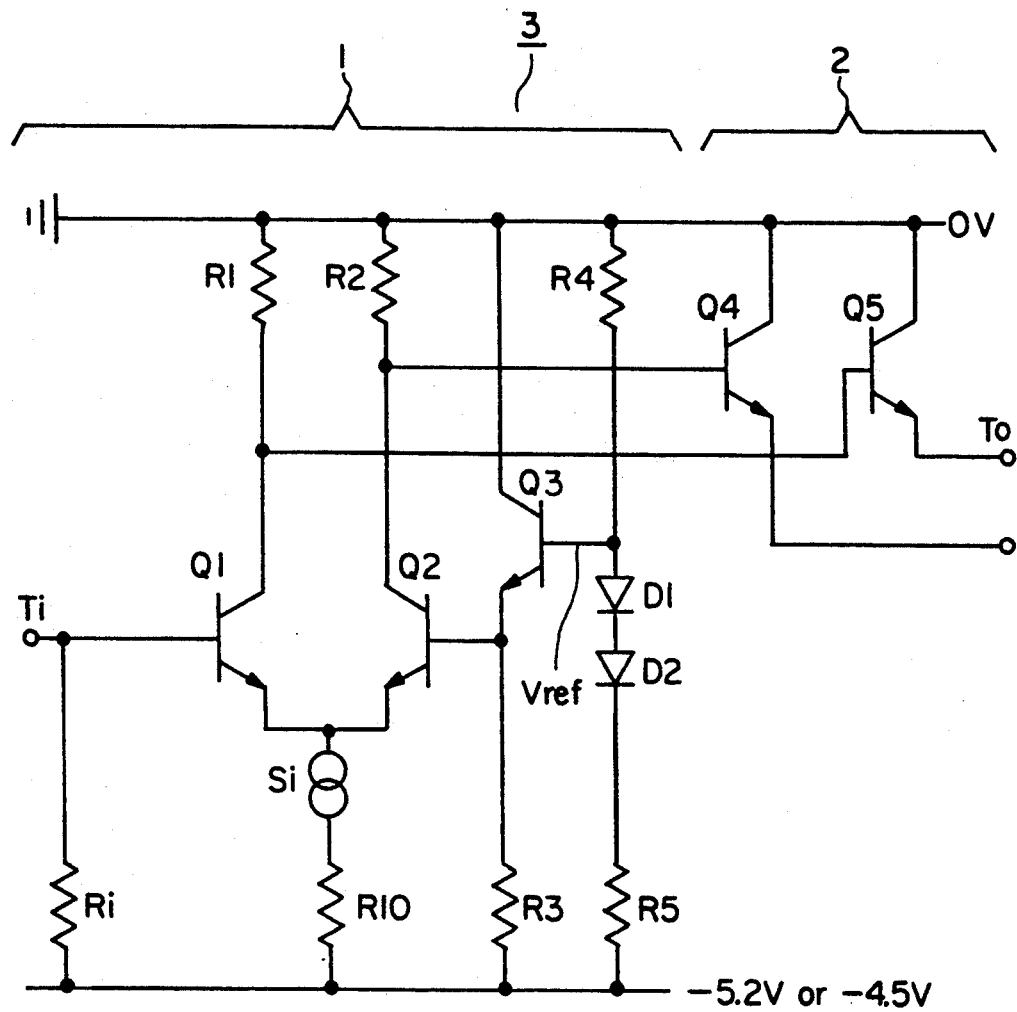
FIG. 1 is a diagram showing an example of a conventional ECL balanced line driver.
Figure 2:
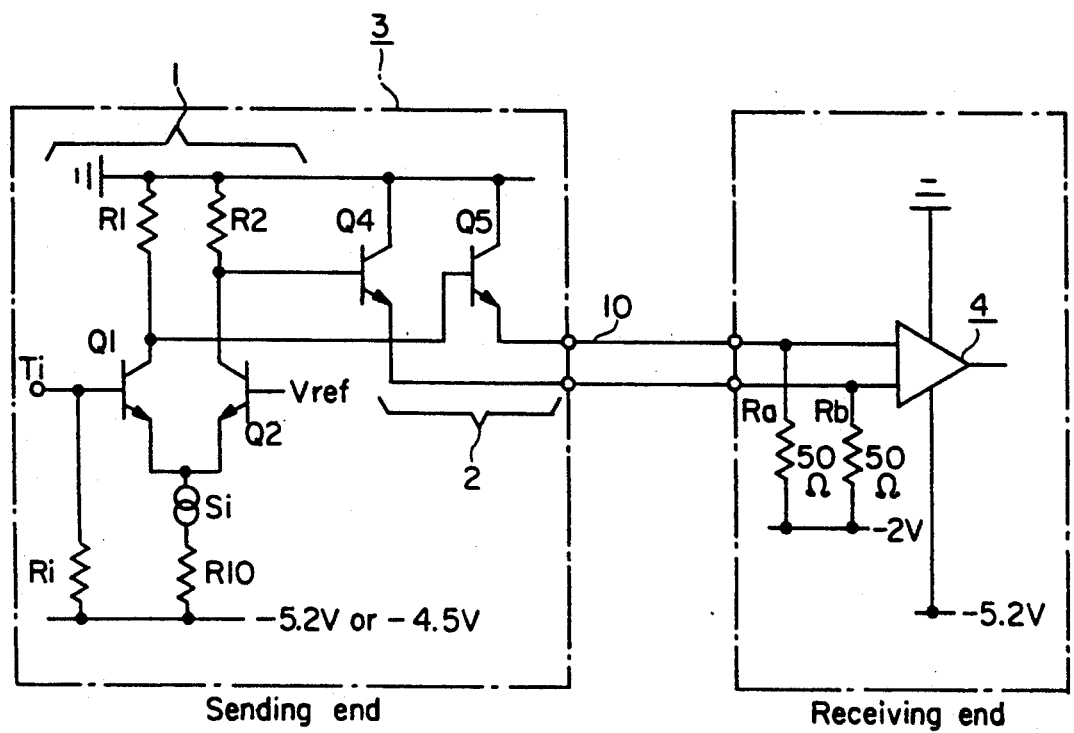
FIG. 2 is a diagram illustrating a conventional balanced line transmission system.
Figure 3:
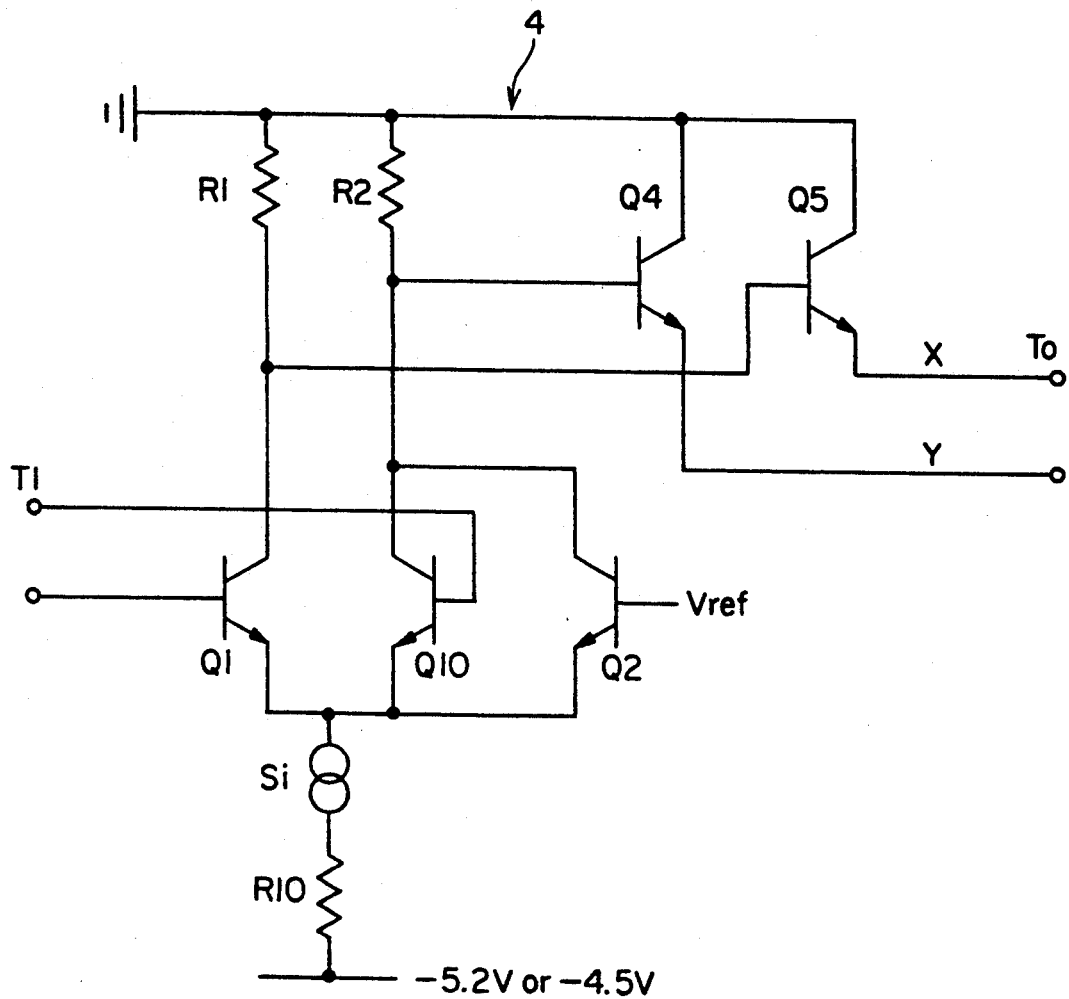
FIG. 3 is a diagram showing a circuit example of a prior art ECL line receiver for a balanced line.

Line driver 3a which includes a differential amplifier 1a and a emitter follower circuit 2a, has substantially the same circuit configuration and function as that shown in FIG. 1 except that resistors R1 and R2 in FIG. 1 are replaced by variable resistor circuits or elements 12 and 13. The collectors of transistors Q11 and Q12 of the differential amplifier 1a are connected to the respective bases of transistors Q15 and Q14 of the emitter follower circuit 2a. The emitter follower circuit 2a provides high input impedance and low output impedance. Voltage source 0 volts (ground) and −5.2 (or −4.5) volts provide power supply to the line driver 3a. An input signal is provided to the base of transistor Q11 via input terminal Ti. The voltage difference between the input signal voltage and the reference voltage Vref is amplified by the differential amplifier 1a and is output to the emitter follower circuit 2a, which drives the balanced line via output terminal To.

The variable resistor circuit 12 is formed of a metal oxide semiconductor field-effect transistor (MOSFET) 12a and resistors R11 an R12 connected in series. A bias voltage, which is obtained by dividing the voltage difference between the voltage sources (ground and −5.2 volts) by resistors R11 and R12 connected in series across the voltage sources, is provided to the gate of the MOSFET 12a. The variable resistor circuit 13 has the same circuit configuration as the variable resistor circuit 12. These ECL logic and MOSFET logic can be easily fabricated on a single chip by using the so-called bi-MOS technology.

The bias voltage for the gate of each of the MOSFETs 12a and 13a is adjusted so that they provide a predetermined resistance (i.e., the resistance corresponding to R1 and R2 in FIG. 1) when they are made conductive by the voltage supplied from the power source.

A signal is input through the input terminal Ti to the differential amplifier 1a, which reproduces the level of the signal. The output of the differential amplifier 1a is output to the emitter follower circuit 2a, which reinforces the drive capability of the line driver 3a. The outputs of the emitter follower circuit 2a at To are then transmitted over the balanced line.

When power supply is turned off and the MOSFETs 12a and 13a are not supplied with power source −5.2 (or −4.5) volts, the MOSFETs 12a and 13a provide a high impedance (which is well known in the art) and prevent a current, that is large enough to keep transistors Q14 and Q15 in a turned-on condition, from flowing into their gates. As a result, the transistors Q14 and Q15 are turned off and, accordingly, no current flows through the terminator resistors Ra and Rb at the receiving end, providing approximately −2 volts to the both inputs of the line receiver 4. Accordingly, when power supply is turned off at the sending end, the line driver circuit of the present invention offers the same condition as in the line-disconnected state, thus quickly and efficiently detecting a power-off state and informing the receiving end of this state.

Figure 6:
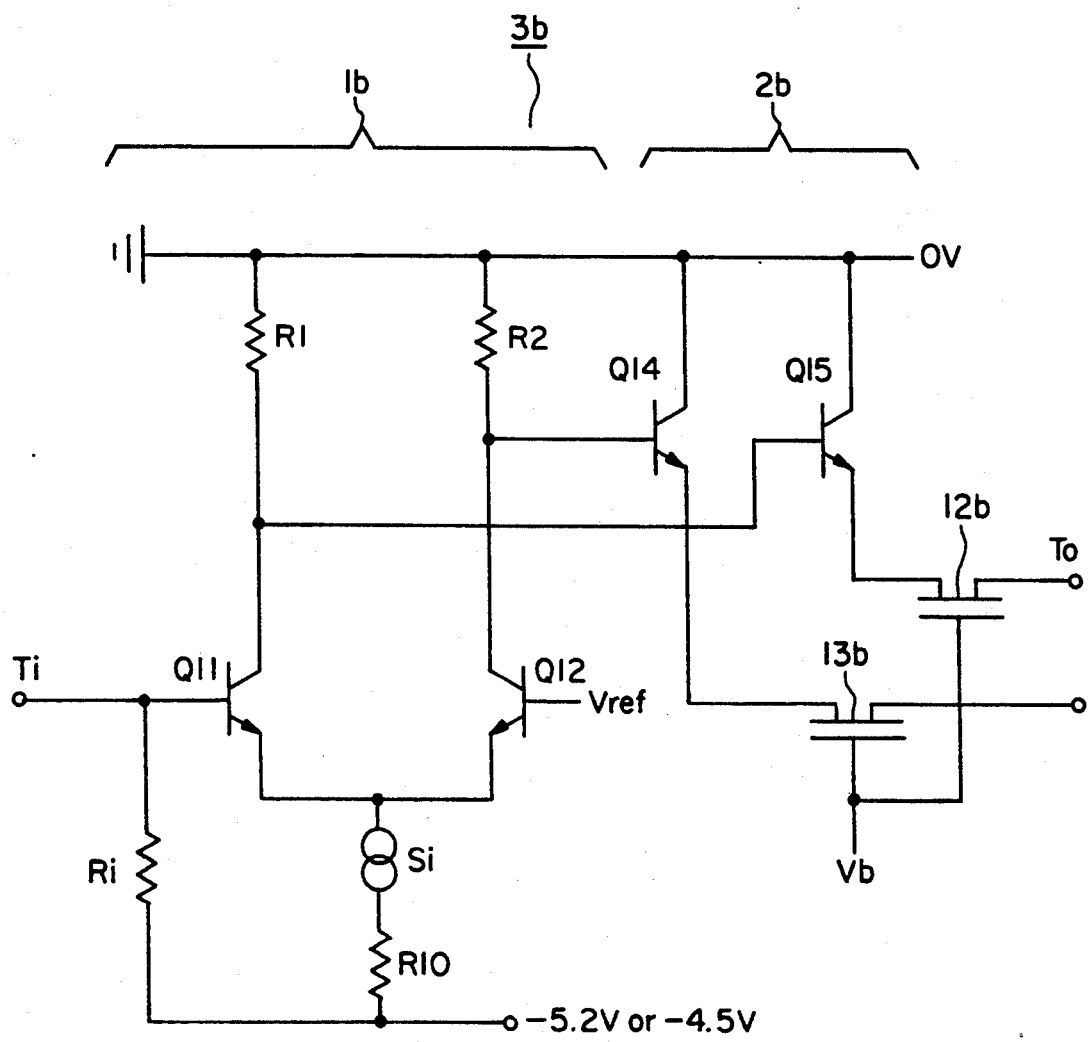
FIG. 6 is a diagram illustrating a line driver circuit of a second embodiment of the present invention.

FIG. 6 is an electric diagram of a line driver circuit of the second embodiment of the present invention.

The line driver 3b of the second embodiment has the same circuit configuration as that of the first embodiment except that MOSFETs 12b and 13b are provided between the two output terminals To and the respective emitters of the transistors Q15 and Q14. Bias voltage Vb is the same bias voltage as used in the first embodiment. In the same way as the first embodiment, when power supply is turned off and the MOSFETs 12b and 13b are not supplied with power source −5.2 volts, the MOSFETs 12b and 13b provide a high impedance, offering the same condition as in the line-disconnected state.

Figure 4:
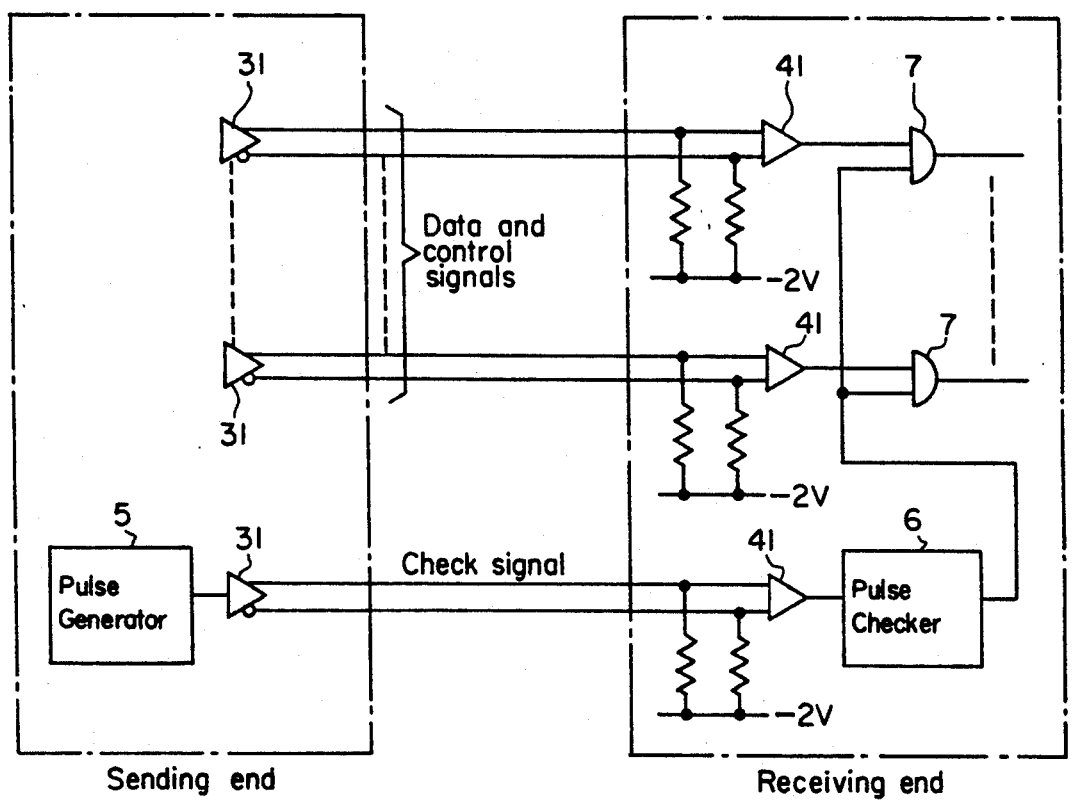
FIG. 4 is a schematic block diagram of a check circuit of the prior art.

As described above, the present invention can detect a power-off state developed at the sending end and inform the receiving end of the state correctly and quickly. Furthermore, the present invention has reduced the amount of check circuit elements approximately by 20 percent as compared to that of the prior art shown in FIG. 4.

Although a MOSFET is described here as an example of a variable resistor element, any element which provides high impedance when power is turned off can be applied to the present invention.

The many features and advantages of the invention are apparent from the detailed specification and thus it is intended by the appended claims to cover all such features and advantages of the invention which fall within the true spirit and scope thereof. Further, since numerous modifications and changes will readily occur to those skilled in the art, it is not desired to limit the exact construction and operation illustrated and described, and accordingly, all suitable modifications and equivalents may be restored to as falling within the scope of the invention.

What is claimed is:

1. An emitter-coupled logic balanced signal transmission circuit for transmitting an ECL signal over a transmission line, the signal transmission circuit comprising:
   a line driver circuit connected to the transmission line for driving the transmission line;
   a power supply connected to said line driver circuit to provide a power source thereto; and
   at least one resistor element included in said line driver circuit and constructed so as to provide a low impedance when the power supply is turned on and a high impedance when the power supply is turned off and thereby causing said line driver circuit to provide a high output impedance to the transmission line when the power supply is turned off, said line driver circuit comprising an emitter-coupled logic differential amplifier and an emitter-coupled logic emitter follower circuit connected thereto for outputting a signal to the transmission line through an output terminal, said at least one resistor element comprising a metal oxide semiconductor field-effect transistor, and wherein said at least one resistor element is connected between an output terminal of said emitter-coupled logic emitter follower circuit and the transmission line.

2. An emitter-coupled logic balanced signal transmission circuit for transmitting an ECL signal over a transmission line, the signal transmission circuit comprising:
a line driver circuit connected to the transmission line for driving the transmission line;
a power supply connected to said line driver circuit to provide a power source thereto; and
at least one resistor element included in said line driver circuit and constructed so as to provide a low impedance when the power supply is turned on and a high impedance when the power supply is turned off and thereby causing said line driver circuit to provide a high output impedance to the transmission line when the power supply is turned off,
said line driver circuit including a differential amplifier and an emitter follower circuit connected thereto for outputting a signal to the transmission line, said at least one resistor element being connected between an output terminal of said emitter follower circuit and the transmission line.

3. An emitter-coupled logic balanced signal transmission circuit according to claim 2, wherein said at least one resistor element is a variable resistor circuit.

4. An emitter-coupled logic balanced signal transmission circuit according to claim 2, wherein said at least one resistor element comprises a metal oxide semiconductor field-effect transistor.

5. An emitter-coupled logic balanced signal transmission circuit according to claim 2, wherein said differential amplifier includes at least one first transistor and said emitter follower circuit includes at least one second transistor and said at least one resistor element is connected between a high voltage source and a collector of said first transistor of said differential amplifier, and said collector is connected to a base of said second transistor of said emitter follower circuit.

6. An emitter-coupled logic balanced signal transmission circuit according to claim 2, wherein two resistor elements connected in parallel are provided in said line driver circuit and each including a MOSFET and two resistors connected in series, each MOSFET being connected to one of the two resistors of each resistor element.

7. An emitter-coupled logic balanced signal transmission circuit according to claim 3, wherein said variable resistor circuit includes a MOSFET and two resistors connected in series, one of said resistors being connected to said MOSFET.

* * * * *